United States Patent [19]
Tanaka et al.

[11] Patent Number: 6,003,655
[45] Date of Patent: Dec. 21, 1999

[54] LEAD FRAME SEPARATING AND CONVEYING APPARATUS

[75] Inventors: Yuji Tanaka; Eiichi Shimazaki, both of Kokubunji; Mitsuo Kosuda, Fussa; Michio Yonemoto, Musashimurayama, all of Japan

[73] Assignee: Kabushiki Kaisha Shinkawa, Tokyo, Japan

[21] Appl. No.: 08/987,987

[22] Filed: Dec. 10, 1997

[30] Foreign Application Priority Data

Dec. 11, 1996 [JP] Japan .................................. 8-346543

[51] Int. Cl.⁶ .................................................. B65G 59/00
[52] U.S. Cl. .................. 198/409; 198/468.2; 414/798.9; 414/778
[58] Field of Search ................................ 198/409, 468.2; 414/798.9, 778

[56] References Cited

U.S. PATENT DOCUMENTS 4,758,126  7/1988  Johnson et al. ....................... 414/798.9
5,547,336  8/1996  Whiteman ............................. 414/798.9
5,585,568  12/1996 Moncreif et al. ..................... 414/798.9

Primary Examiner—William E. Terrell
Assistant Examiner—Mark A. Deuble
Attorney, Agent, or Firm—Koda & Androlia

[57] ABSTRACT

A lead frame separating and conveying device used with, for instance, a wire bonding apparatus, including a frame separating assembly that includes frame guides which support lead frames that are lined up with the flat surfaces in a vertical direction, frame suspension guides which are installed above the front ends of the frame guides in the feeding direction of the lead frames, and a frame pusher which pushes the rear end of the lead frames lined up on the frame guides so as to convey the lead frames onto the frame suspension guides. The frame suspension guides supports the lead frames in a suspended fashion and have frame separating sections which are inclined upward.

3 Claims, 2 Drawing Sheets

LEAD FRAME SEPARATING AND CONVEYING APPARATUS

BACKGROUND OF THE INVENTION

1. Field of the Invention

The present invention relates to a lead frame separating and conveying apparatus used for semiconductor devices.

2. Prior Art

There are two types of known systems for storing large numbers of plate-form workpieces such as lead frames, etc.

The first type is a horizontal positioning system (stacking system) in which a plurality of plate-form workpieces are stored one on the other with the workpieces being placed in a horizontal attitude or the flat surfaces being set in the horizontal direction. This system further includes two types: an uppermost-rank separating type, in which the plate-form workpieces are removed starting with the uppermost workpiece, and a lowermost-rank separating type, in which the plate-form workpieces are removed beginning with the lowermost workpiece.

An example of the uppermost-rank separating type is described in Japanese Utility Model Application Publication (Kokoku) No. 63-42529, and an example of the lowermost-rank separating type is described in Japanese Patent Application Publication (Kokoku) No. 6-76146.

In these types of plate-form workpiece storing systems, lead frames are placed one on the other so that their positions are shifted in the form of a staircase. Thus, the lead frames are prevented from sticking together and are separated reliably one lead frame at a time.

The second type of system is a vertical positioning system in which plate-form workpieces are lined up in the conveying direction with the width directions of the workpieces (or the surfaces of the workpieces) being oriented in a vertical direction.

Japanese Utility Model Application Laid-Open (Kokai) No. 58-20230 discloses an example of this system.

In this system, plate-form workpieces are lined up in the conveying direction and set on an inclined stand with the flat surfaces thereof oriented in a vertical direction, and the rear end of the line of plate-form workpieces is pushed by an inclined slider, so that the workpieces are dropped one at a time onto a belt conveyor.

In the case of the horizontal positioning system (stacking system), the overall weight of the stacked plate-form workpieces is concentrated in the lower portion of the stack; accordingly, parts having a sufficient strength must be used for supporting the workpieces, and as a result the cost of the apparatus tends to be high. Furthermore, especially in the lowermost-rank separating system, all of the plate-form workpieces must be removed at one time if there is a trouble with parts such as claws used for removing the workpiece, etc. or if plate-form workpieces with a defective shape are mixed with the non-defective workpieces.

In this regard, with the vertical positioning system, the removal of defective plate-form workpieces onto the belt conveyer is easier. However, since the plate-form workpieces are merely caused to slide over the inclined stand, plate-form workpieces that are stuck together are sometimes not separated. Furthermore, when the plate-form workpieces are pushed by the inclined slider, the bottom surfaces of the plate-form workpieces rub against the surface of the inclined stand so that frictional resistance is generated. As a result, a driving means that pushes the plate-form workpieces with a driving force which exceeds the combined force of this frictional resistance plus the weight of the plate-form workpieces due to the inclined stand is required. Thus, the cost of the apparatus increases for this reason as well.

Furthermore, when the plate-form work pieces on the inclined stand are dropped onto the belt conveyor so as to be conveyed by the belt conveyor, each plate-form workpiece is dropped onto the belt conveyor while the end portion of such plate-form workpiece is in contact with another plate-form workpiece on the inclined stand. As a result, the plate-form workpieces are scratched. Moreover, the plate-form workpieces on the inclined stand are pushed by the inclined slider and dropped naturally onto the belt conveyor by their own weights; accordingly, there is a danger that two or more plate-form workpieces are dropped continuously. Furthermore, since the plate-form workpieces are naturally dropped by the gravity, only the plate-form workpieces that are flat with no projections can be used in this vertical positioning system.

SUMMARY OF THE INVENTION

Accordingly, the first object of the present invention is to provide a lead frame separating and conveying apparatus that can reliably separate lead frames one at a time with a small driving force to push the lead frames, thus reducing the cost of the apparatus.

The second object of the present invention is to provide a lead frame separating and conveying apparatus that can easily separate not only flat lead frames with no projections but also deformed lead frames which has projections.

The third object of the present invention is to provide a lead frame separating and conveying apparatus that can convey lead frames one at a time reliably without scratching the surfaces of the lead frames.

The above objects, particularly the first and second objects, are accomplished by a unique structure for a lead frame separating and conveying apparatus that includes a frame separating means which separates, one at a time, lead frames that are lined up in the conveying direction with the direction of width of the lead frames vertically oriented, and the frame separating means includes: frame guides which support the lead frames that are lined up in the conveying direction with the direction of width of lead frames vertically oriented; frame suspension guides which are installed above the front ends of the frame guides in the feeding direction of the lead frames fed along said frame guides, the frame suspension guides carrying the lead frames in a manner that the lead frames are suspended and having separating sections that are inclined upward; a frame pusher which pushes against the rear end of the lead frames lined up on the frame guides, the rear end being with respect to the feeding direction of the frames; and a driving means which actuates the frame pusher.

The above objects are further accomplished by a unique structure of the present invention for a lead frame separating and conveying apparatus that includes the above described frame separating means and further includes a chuck-conveying means which chucks and conveys, one at a time, the lead frames separated by the separating sections of the frame suspension guides of the frame separating means.

The above objects are further accomplished by a unique structure of the present invention for a lead frame separating and conveying apparatus which includes the abovedescribed frame separating means and chuck-conveying means and further includes a transfer means that receives and places the lead frames on guide rails which are installed on a rail supporting stand so as to guide the lead frames to a bonding position.

BRIEF DESCRIPTION OF THE DRAWINGS

FIG. 3 illustrates one type of a lead frame, in which

DETAILED DESCRIPTION OF THE INVENTION

One embodiment of the present invention will be described with reference to FIGS. 1 through 3.

Figure 1:
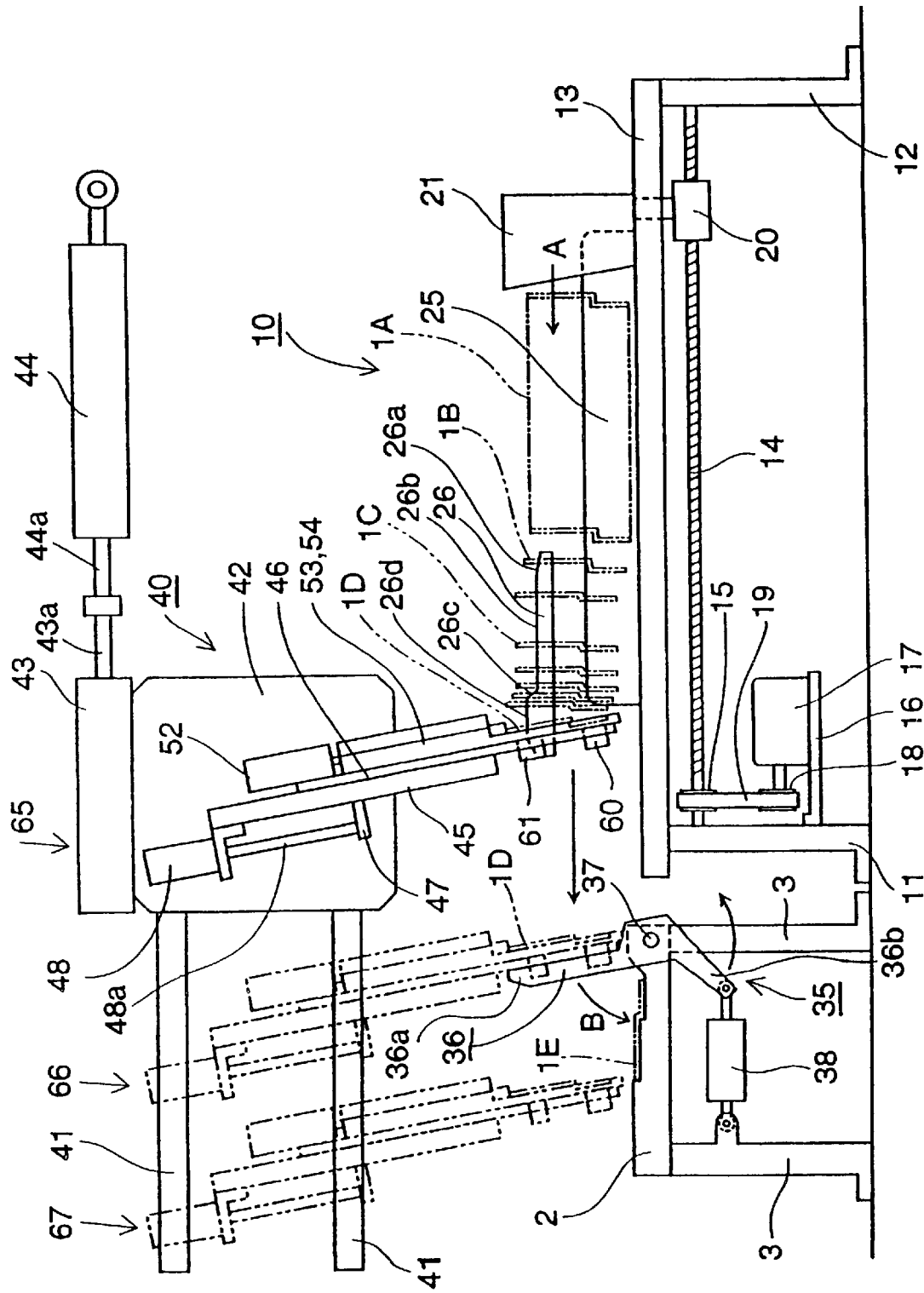
FIG. 1 is a front view of one embodiment of the lead frame separating and conveying apparatus according to the present invention.

As shown in FIG. 1, the shown embodiment is constructed from a frame separating means 10 which separates lead frames 1 (1A, 1B, 1C, 1D, 1E, referred to by different numerals depending upon the progress of the method), a frame transfer means 35 which places the lead frames 1 on a guide rail 2 that guides the lead frames 1 to a bonding position (not shown), and a chuck-conveying means 40 which chuck-holds the lead frames 1 separated by the frame separating means 10 and transfers the lead frames 1 to the frame transfer means 35.

Figures 3A, 3B:
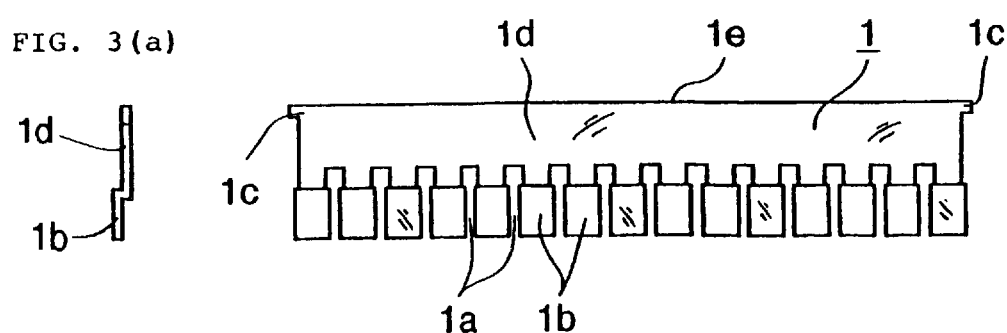
FIG. 3(a) is a front view.
FIG. 3(b) is a side view thereof when viewed with reference to FIG. 1.

As shown in FIG. 3, a lead frame 1 generally has, in its base 1d, a plurality of islands 1b separated by grooves 1a, and it also has projecting ends 1c formed on the upper portions of both ends. As seen from FIG. 3(a), the islands 1b, which are flat, protrude from a base 1d; thus, the lead frame 1 is in a plate form having flat surfaces of the base 1d and islands 1b.

The frame separating means 10 is structured in the following manner.

The frame separating means 10 is installed at one side (right side in FIG. 1) of the guide rail 2 and includes a base plate 13 fastened to two supporting plates 11 and 12 which are installed so as to face each other. An external screw shaft 14 is supported between the supporting plates 11 and 12 so as to be axially rotated, and a driven pulley 15 is fastened to one end of this external screw shaft 14. A motor 17 is mounted on a motor stand 16 which is fastened to the supporting plate 11. A drive pulley 18 is fastened to the output shaft of this motor 17, and a belt 19 is mounted between the drive pulley 18 and the driven pulley 15. An internal screw block 20 is screw-engaged with the external screw shaft 14, and a frame pusher 21 is attached to this screw block 20. The frame pusher 21 is set inside an elongated slot (not shown) which is opened in the base plate 13 so as to be parallel to and positionally correspond to the external screw shaft 14.

Figure 2:
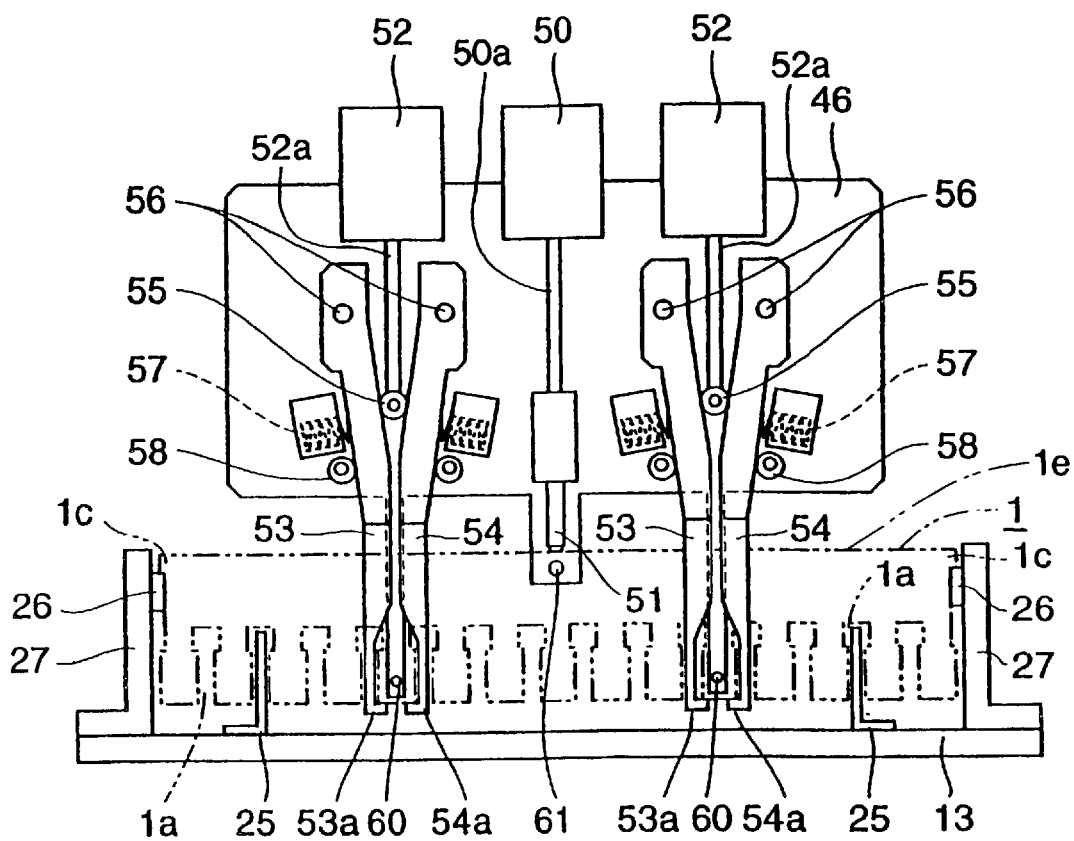
FIG. 2 is a right-side view of the chuck-conveying means used in the apparatus shown in FIG. 1.

As best seen from FIG. 2, two frame guides 25 are installed on the upper surface of the base plate 13 (FIG. 1 showing one of the two) so as to be parallel to the axial direction of the external screw shaft 14. These frame guides 25 carry the lead frames 1 so that the upper ends of the grooves 1a of the lead frames 1 are put on the frame guides 25 when the lead frames 1 are vertically oriented or the islands 1b face downward as shown in FIG. 3(b).

Two frame suspension guides 26 which support the undersurfaces of the projecting ends 1c of each lead frame 1 are installed so as to face each other above the front ends (right side end in FIG. 1) of the frame guides 25 with respect to the lead frame conveying direction shown by arrow A that are fed along the frame guides 25 by the frame pusher 21. These frame suspension guides 26 are provided on side plates 27 which are fastened to the base plate 13. Furthermore, along the conveying direction of the lead frames 1 (or in the direction arrow A), the upper surface of each of the frame suspension guides 26 is continuously formed with a guide section 26a which is inclined upward, a first horizontal section 26b, a separating section 26c which is inclined upward, and a second horizontal section 26d.

The transfer means 35 is structured as described below.

The transfer means includes a transfer member 36. The transfer member 36 which receives the lead frames 1 from the chuck-conveying means 40 and transfers them to the guide rail 2 is provided on the guide rail 2 in a pivotal fashion by way of a supporting shaft 37. The transfer member transfer member is located near the frame separating means 10. Here, the guide rail 2 is provided with a groove (not shown) which is formed so that the lead frame carrying section 36a of the transfer member 36 can pass through the guide rail 2. One end 36b of the transfer member 36 is pivot-linked to the operating rod of a transfer cylinder 38 so that the transfer member 36 is free to pivot, and this transfer cylinder 38 is pivotally attached to the rail supporting stand 3 which supports the guide rail 2.

Next, the structure of the chuck-conveying means 40 will be described below.

Above the guide rail 2, two rails 41 which are fastened to a fixing part (not shown) of the apparatus are installed so that they are parallel to each other and above and below, and a horizontally moving plate 42 is installed on the rails 41 so as to be movable horizontally along these rails 41. A first horizontal movement cylinder 43 is fastened to the horizontally moving plate 42, and the operating rod 44a of a second horizontal movement cylinder 44 which is fastened to a fixing part of the apparatus is connected to the operating rod 43a of the first horizontal movement cylinder 43.

A chuck stand 45 is fastened to the horizontally moving plate 42 in a substantially vertical orientation, as seen from FIG. 1, with the lower end of the chuck stand 45 inclined toward the frame suspension guides 26. A raising-and-lowering plate 46 is installed on the upper surface of the chuck stand 45 so as to be movable upward and downward along the upper surface of the chuck stand 45; and in addition, an operating plate 47 which passes through a vertically oriented slot (not shown) opened in the chuck stand 45 is fastened to the undersurface of the raising-and-lowering plate 46. The operating rod 48a of a raising-and-lowering cylinder 48 which is fastened to the upper portion of the undersurface of the chuck stand 45 is connected to the operating plate 47.

As seen from FIG. 2, a holder cylinder 50 is fastened to the central portion of the raising-and-lowering plate 46, and a holder 51 which presses against the upper end of each lead frame 1 is attached to the operating rod 50a of the holder cylinder 50. Furthermore, holding arm opening-and-closing cylinders 52 are fastened to the raising-and-lowering plate 46 so that they are located on both sides of the holder cylinder 50. Rollers 55 which act on pairs of holding arms 53 and 54 are provided on the operating rods 52a of the holding arm opening-and-closing cylinders 52 so that the rollers 55 are rotatable at the ends of the operating rods 52a. The holding arms 53 and 54 are mounted on the raising-and-lowering plate 46 at their upper ends via supporting shafts 56 so that the holding arms 53 and 54 are pivotable about the supporting shafts 56, and claw arms 53a and 54a which come to engage with the lower edges of islands 1b of the lead frames 1 are formed on the lower ends of the holding arms 53 and 54. The holding arms 53 and 54 are urged in the closing direction (or driven toward each other) by springs 57, and the open amount of the holding arms 53 and 54 is regulated by eccentric stoppers 58.

In addition, a pair of sensors 60 and a single sensor 61 are provided on the inclined surface of the raising-and-lowering plate 46 so that these sensors 60 and 61 are positioned near the claw arms 53a and 54a. The sensors 60 detect the lower portion of each lead frame 1, and the sensor 61 detects the upper portion of each lead frame 1

In operation, the horizontally moving plate 42 is initially positioned at the frame receiving position that is indicated by the solid line in FIG. 1. A plurality of lead frames 1A are placed on the frame guides 25 so that the lead frames 1A are set between the frame pusher 21 and the frame suspension guides 26 with the width directions of the lead frames 1A being oriented in a vertical direction or in the direction in which the base 1d of the lead frames 1 extend vertically.

When a start button (not shown) is turned ON, the motor 17 is rotated, and the external screw shaft 14 is rotated via the drive pulley 18, belt 19 and driven pulley 15. As a result, the internal screw block 20 and the frame pusher 21 attached to the block 20 are moved in the direction of arrow A and push the lead frames 1A on the frame guides 25 toward the frame suspension guides 26.

The lead frames 1B pushed onto the guide sections 26a of the frame suspension guides 26 are guided by the guide sections 26a and lifted and then fed to the first horizontal sections 26b. Thus, the lead frames 1C are suspended by the frame suspension guides 26. In FIG. 1, it is shown that the lead frame 1B on the guide sections 26a and on the first horizontal sections 26b are spacedly suspended; however, in actuality, these lead frames are in contact with each other. The lead frames 1C suspended from the first horizontal sections 26b are separated one at a time by the rising inclined surfaces of the separating sections 26c and then fed onto the second horizontal sections 26d; after which the first or leading lead frame 1D (shown at the left end of the rows of lead frames) is pressed against the holding arms 53 and 54; as a result, the sensors 60 and 61 are actuated. The signals outputted by the sensors 60 and 61 cause the motor 17 to stop; and at the same time, the holding arm opening-and-closing cylinders 52 are actuated, and then the holder cylinder 50 is actuated.

As best seen from FIG. 2, when the holding arm opening-and-closing cylinders 52 are actuated, the operating rods thereof are retracted; and when the holder cylinder 50 is actuated, the operating rod thereof protrudes. When the operating rods of the holding arm opening-and-closing cylinders 52 are retracted, the claw part 53a and 54a of the holding arms 53 and 54 are closed by the driving force of the springs 57 so that the islands 1b of the lead frame 1A are held by the claw part 53a and 54a. After this, the operating rode of the holder cylinder 50 protrudes. When the operating rod of the holder cylinder 50 protrudes, the holder 51 comes into contact with and presses against the top edge 1e of the lead frame 1A. Thus, the holder 51 presses the lead frame 1D against the claw arms 53a and 54a of the holding arms 53 and 54; as a result, the lead frame 1D is held by the holding arms 53 and 54 and by the holder 51.

Afterward, the operating rod 44a of the horizontal movement cylinder 44 protrudes, so that the horizontally moving plate 42 is moved from the frame receiving position 65 to the pre-frame-transfer position 66. In other words, the lead frame 1D held by the holding arms 53 and 54 and the holder 51 is moved to a position slightly in front of the transfer member 36, which is in substantially an upright state as shown from FIG. 1. Then, the operating rod 50a of the hold cylinder 50 is retracted, and the operating rods 52a of the holding arm opening-and-closing cylinders 52 are protruded. As a result, the holder 51 and holding arms 53 and 54 release the lead frame 1D onto the transfer member 36.

Next, the operating rod 43a of the horizontal movement cylinder 43 is protruded, so that the horizontally moving plate 42 is moved to the transfer completion position 67. At this time, the lead frame 1A is transferred to the transfer member 36.

Next, the operating rod of the transfer member cylinder 38 is caused to protrude, so that the transfer member 36 rotates in the direction indicated by arrow B and places the lead frame 1D on the guide rail 2. After this, the transfer member 36 stops in a position slightly below the groove parts in the guide rail 2 so that the lead frame 1A is placed on the guide rail 2; and then the lead frame 1E on the surface of the guide rail 2 is fed away by a feeding means (not shown), the operating rod of the transfer stand cylinder 38 is retracted, so that the transfer member 36 returns to its original position which is as shown in FIG. 1.

When, as described above, the horizontally moving plate 42 has moved to the transfer completion position 67, the operating rod of the raising-and-lowering cylinder 48 is subsequently retracted, so that the raising-and-lowering plate 46, i.e., the holder 51 and the holding arms 53 and 54, are raised.

Next, the operating rod 43a of the horizontal movement cylinder 43 and the operating rod 44a of the horizontal movement cylinder 44 are retracted, so that the horizontally moving plate 42 returns to the original frame receiving position 65 shown by the solid line in FIG. 1.

Afterward, the operating rod of the raising-and-lowering cylinder 48 is protruded so that the raising-and-lowering plate 46 is lowered so that the holder 51 and the holding arms 53 and 54 are positioned to be ready to hold the next leading or first lead frame 1 on the second horizontal sections 26d of the frame suspension guides 26. The motor 17 is next rotated so that the lead frame 1 is brought to approach the sensors 60 and 61.

Afterward, the operation described above is repeated.

As seen from the above, lead frames 1 are suspended by the frame suspension guides 26; and the lead frames 1 in this suspended state are separated by the separating sections 26c of the frame suspension guides 26. Accordingly, the lead frames 1 can be reliably separated one lead frame at a time. In addition, since only a small driving force which pushes the lead frames 1 is required, the cost of the apparatus can be reduced.

In the above, a description is made for lead frames that have projected islands; however, it goes without saying that flat lead frames that have no projected islands can also be easily separated by the structure described above.

Furthermore, the lead frames 1 separated by the separating sections 26c of the frame suspension guides 26 are chucked and then conveyed one at a time by the chuck-conveying means 40; accordingly, the lead frames 1 can be reliably conveyed one lead frame at a time without scratching the surfaces of the lead frames 1.

As seen from the above, according to the present invention, the frame separating means is provided with: frame guides which carry the lead frames that are lined up in the conveying direction with the surfaces of the lead frames vertically oriented; frame suspension guides for carrying the lead frames thereon in a manner that the lead frames are suspended, the frame suspension guides being installed above the front ends of the frame guides in the direction in which the lead frames are fed and having frame separating sections that are inclined upward; a frame pusher which pushes the lead frames lined up on the frame guides; and a driving means which moves this frame pusher. Accordingly, lead frames are reliably separated one lead frame at a time; and only a smaller driving force which pushes the lead frames is required, so that the cost of the apparatus can be reduced. Moreover, any type of lead frames, with or without projected islands, can easily be separated.

Furthermore, since the lead frames which are separated by the separating sections of the frame suspension guides are chucked and then conveyed one at a time by the chuck-conveying means, the lead frames are reliably conveyed one lead frame at a time without scratching the surfaces of the lead frames.

What is claimed is:

1. A lead frame separating and conveying apparatus that includes a frame separating means for separating, one at a time, lead frames that are lined up in a lead frame conveying direction in which said lead frames are conveyed with flat surfaces thereof oriented in a vertical direction, said free separating means comprising;

frame guides which support thereon said lead frames that are lined up in said frame conveying direction with flat surfaces thereof vertically oriented;

frame suspension guides for carrying thereon said lead frames in a manner that said lead frames are suspended, said frame suspension guides being provided with frame separating sections thereon and installed above front ends of said frame guides with respect to said frame conveying direction;

a frame pusher which pushes said lead frames lined up on said frame guides, said frame pusher pushing a rear end lead frame of said lined up lead frames with respect to said frame conveying direction;

a driving means which actuates said frame pusher;

a supporting means;

guide rail means provided on said supporting means, said guide rail means for guiding the lead frames to a bonding position; and transfer means provided on said supporting means, said transfer means for transferring said lead frames on said frame suspension guides to said guide rail means.

2. A lead frame separating and conveying apparatus including a frame separating means for separating, one at a time, lead frames that are lined up in a lead frame conveying direction in which said lead frames are conveyed with flat surfaces thereof oriented in a vertical direction, said frame separating means comprising:

frame guides which support thereon said lead frames that are lined up in said frame conveying direction with flat surfaces thereof vertically oriented;

frame suspension guides for carrying thereon said lead frames in a manner that said lead frames are suspended, said frame suspension guides being provided with frame separating sections thereon and installed above front ends of said frame guides with respect to said frame conveying direction;

a frame pusher which pushes said lead frames lined up on said frame guides, said frame pusher pushing a rear end lead frame of said lined up lead frames with respect to said frame conveying direction;

a driving means which actuates said frame pusher, a supporting means;

guide rails means provided on said supporting means, said guide rail means for guiding the lead frames to a bonding position; and transfer means provided on said supporting means, said transfer means for transferring lead frames from said frame suspension guides to said guide rail so as to guide said lead frames to a bonding position; and a chuck-conveying means which holds and conveys, one at a time, said lead frames separated by said separating sections of said frame suspension guides of said frame separating means.

3. A lead frame separating and conveying apparatus including a frame separating means for separating, one at a time, lead frames that are lined up in a lead frame conveying direction in which said lead frames are conveyed with flat surfaces thereof oriented in a vertical direction, said frame separating means comprising:

frame guides which support thereon said lead fires that are lined up in said frame conveying direction with flat surfaces thereof vertically oriented;

frame suspension guides for carrying thereon said lead frames in a manner that said lead frames are suspended, said frame suspension guides being provided with frame separating sections thereon and installed above front ends of said frame guides with respect to said frame conveying direction;

a frame pusher which pushes said lead frames lined up on said frame guides, said frame pusher pushing a rear end lead frame of said lined up lead frames with respect to said frame conveying direction;

a driving means which actuates said frame pusher, a rail supporting stand, guide rails provided on said rail supporting stand for guiding said lead frames to a bonding position, a transfer means that receives said lead frames and places said lead frames on said guide rails which are installed on said rail supporting stand so as to guide said lead frames to a bonding position, and a chuck-conveying means which holds and conveys, one at a time, said lead frames separated by said separating sections of said frame suspension guides of said frame separating means.

* * * * *